(12) United States Patent
Yamato et al.

(10) Patent No.: US 6,388,201 B2
(45) Date of Patent: May 14, 2002

(54) WIRED CIRCUIT BOARD

(75) Inventors: Takeshi Yamato; Kenichiro Ito, both of Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/866,813

(22) Filed: May 30, 2001

(30) Foreign Application Priority Data

Jun. 8, 2000 (JP) ........................................ 2000-172034

(51) Int. Cl.[7] .................................................. H05K 1/00
(52) U.S. Cl. ..................... 174/255; 174/250; 174/254; 174/258; 361/751; 361/792; 361/807
(58) Field of Search ................................. 174/250, 254, 174/255, 256, 261, 260, 258, 259, 262, 265, 266, 72 A; 361/748, 749, 751, 792, 752, 793, 807; 360/137

(56) References Cited

U.S. PATENT DOCUMENTS

| | | | | |
|---|---|---|---|---|
| 5,495,665 A | * | 3/1996 | Carpenter et al. | 29/830 |
| 5,598,307 A | * | 1/1997 | Bennin | 360/245.9 |
| 5,737,837 A | * | 4/1998 | Inaba | 29/884 |
| 5,835,306 A | * | 11/1998 | Bennin | 360/234.5 |
| 5,879,787 A | * | 3/1999 | Petefish | 428/209 |
| 5,978,177 A | * | 11/1999 | Takasugi | 360/245.9 |
| 6,100,582 A | * | 8/2000 | Omote et al. | 257/699 |
| 6,162,996 A | * | 12/2000 | Schmidt et al. | 174/259 |
| 6,198,052 B1 | * | 3/2001 | Omote et al. | 174/245.9 |

* cited by examiner

*Primary Examiner*—Jeffrey Gaffin
*Assistant Examiner*—Ishwar B Patel
(74) *Attorney, Agent, or Firm*—Kubovcik & Kubovcik (57) ABSTRACT

To provide a wired circuit board capable of surely preventing occurrence of a short circuit between a metal terminal layer and a metal supporting layer with a simple construction, to provide improvement in connection reliability and in voltage proof property, a wired circuit board comprises a base layer formed on a supporting board, a conductive layer formed on the base layer, a surface of the conductive layer being exposed by opening the supporting board and the base layer, and a metal plated layer formed on the conductive layer exposed in the openings of the supporting board and the base layer, wherein a specified space is defined between a periphery of the metal plated layer and a periphery of the opening of the supporting board.

3 Claims, 9 Drawing Sheets

WIRED CIRCUIT BOARD

BACKGROUND OF THE INVENTION

1. Field of the Invention

The present invention relates to a wired circuit board and, more particularly, to a wired circuit board suitably used for a suspension board with circuit.

2. Description of the Prior Art

Figure 11:
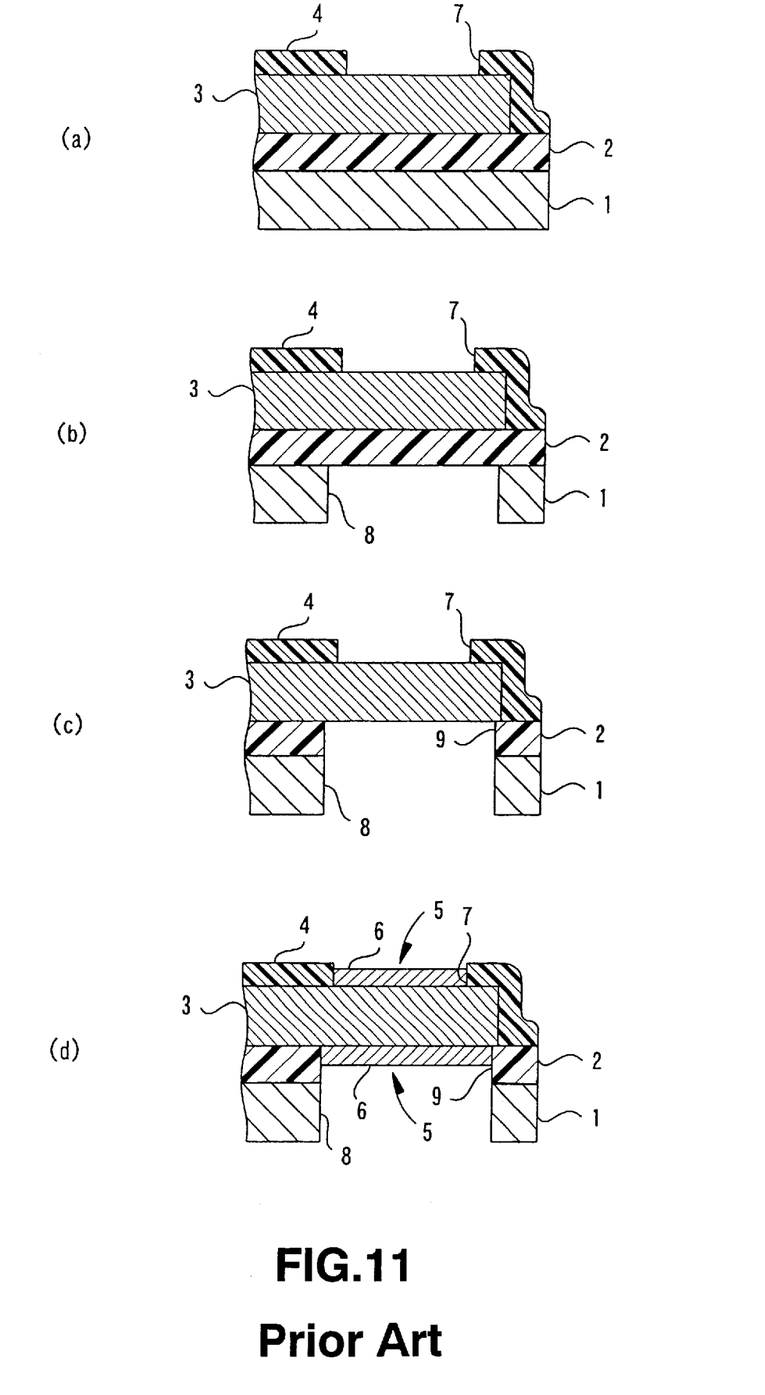

For example, a suspension board with circuit used for a hard disk drive comprises a supporting board 1 made of stainless steel foil, a base layer 2 formed of an insulating material formed on the supporting board 1, a conductive layer 3 formed on the base layer 2 in the form of a specific circuit pattern, and a cover layer 4, formed of an insulating material, for covering the conductive layer 3, as shown in FIG. 11(d).

The suspension board with circuit, prevalent nowadays as the so-called Flying Lead, is formed to have terminals 5 formed on both sides of the conductive layer 3, rather than in only either side thereof, in order to meet the demand of recent years for electronic equipment to have increasingly higher density and reduced size.

Conventionally, the terminals 5 of the suspension board with circuit are formed on both sides of the conductive layer 3 in the following manner. First, the cover layer 4 is formed and simultaneously opened by use of a photo-resist and the like to form a first opening 7 for forming the terminal 5 in the cover layer 4 and expose a front side of the conductive layer 3, as shown in FIG. 11(a). Then, a second opening 8 for the terminal 5 to be formed in the supporting board 1 is formed in the supporting board 1 by a chemical etching and the like, as shown in FIG. 11(b). Sequentially, with the supporting board 1 as a mask, the base layer 2 exposed in the second opening 8 is opened by a plasma etching and the like, to form a third opening 9 for the terminal 5 to be formed in the base layer 2, so that a back side of the conductive layer 3 is exposed, as shown in FIG. 11(c). Thereafter, metal plated layers 6 are formed on both sides of the conductive layer 3 thus exposed, as shown in FIG. 11(d).

The metal plated layer 6 thus formed extends over the whole area of the conductive layer 3 exposed in the whole area of the third opening 9 in the base layer 2 formed by using the supporting board 1 as the mask, without leaving any space between the periphery of the metal plated layer 6 and the periphery of the third opening 9 in the base layer 2. As a result of this, the metal plated layer 6 formed in the second opening 8 also extends in the thickness direction thereof, without leaving any space between the periphery of the metal plated layer 6 and the periphery of the second opening 8 in the supporting board 1. Due to this, depending on thickness of the metal plated layer 6 formed, the metal plated layer 6 can contact the periphery of the opening 8 in the supporting board 1 to cause a short circuit from the contact between the metal plated layer 6 and the supporting board 1.

In practice, since the third opening 9 in the base layer 2 is formed with the second opening 8 of the supporting board 1 as the mask, the third opening 9 is sometimes made slightly larger than the second opening 8 in the supporting board 1, as shown in FIG. 11(d). This increases the risk of a short circuit being caused from contact between the metal plated layer 6 and the supporting board 1.

It is the object of the invention to provide a wired circuit board capable of surely preventing occurrence of a short circuit between a metal terminal layer and a metal supporting layer with a simple construction, to provide improvement in connection reliability and in voltage proof property.

SUMMARY OF THE INVENTION

The present invention is directed to a novel wired circuit board comprising an insulating layer formed on a metal supporting layer, a conductive layer formed on the insulating layer, a surface of the conductive layer being exposed by opening the metal supporting layer and the insulating layer, and a metal terminal layer formed on the conductive layer exposed in the openings of the metal supporting layer and the insulating layer, wherein a specified space is defined between a periphery of the metal terminal layer and a periphery of the opening of the metal supporting layer.

With this construction, since the specified space is defined between the periphery of the metal terminal layer and the periphery of the opening of the metal supporting layer, contact between the periphery of the metal terminal layer and the periphery of the opening of the metal supporting layer can be surely prevented. This can surely prevent occurrence of a short circuit caused from the contact therebetween, thus providing improved connection reliability and voltage proof property of the suspension board with circuit.

It is preferable that the conductive layer has a terminal forming portion for forming the metal terminal layer and the terminal forming portion is hollowed toward the metal supporting layer with respect to the remaining portions of the conductive layer.

With this construction, the distance from the front side of the metal supporting layer to the front side of the metal terminal layer is shortened to an extent corresponding to the hollowed portion from the remaining portion and, as a result of this, the metal terminal layer is placed closer to the outside of the metal supporting layer to that extent. This can produce the effect that for example when the connecting terminals of an external circuit are connected with the metal terminal layers in such a manner that those connecting terminals are laid over the metal terminal layers and are bonded to each other via supersonic vibration of a bonding tool, the pressure bonding can be well ensured, thus providing further improved connection reliability.

The wired circuit board of the present invention can be used as a suspension board with circuit.

BRIEF DESCRIPTION OF THE DRAWINGS

In the drawings:

FIG. 3 illustrates in section the steps of preparing a supporting board and forming on the supporting board a base layer with a specified pattern, of the method of producing the suspension board with circuit presented as an embodiment of the method of producing a wired circuit board of the present invention, (a) shows the step of preparing a supporting board;

(b) shows the step of forming a coating of a precursor of a photosensitive polyimide resin on the supporting board;

(c) shows the step of exposing the coating to light through a photomask and developing it to form a specified pattern; and (d) shows the step of curing the patterned coating to form the base layer, FIG. 4 illustrates in section the steps of forming on the base layer a conductive layer with a specified circuit pattern, (a) shows the step of forming a ground on the supporting board and the base layer;

(b) shows the step of forming on the ground a plating resist of an opposite pattern to the specified circuit pattern;

(c) shows the step of forming a conductive layer of a specified circuit pattern on a portion of the base layer in which no plating resist is formed, by using an electrolysis plating;

(d) shows the step of removing the plating resist; and (e) shows the step of removing the ground, FIG. 5 illustrates in section the steps that after a surface of the conductive layer of the circuit pattern is protected by a thin metal film, the surface of the conductive layer is covered with a cover layer, (a) shows the step of forming the thin metal film on surfaces of the conductive layer;

(b) shows the step of forming a coating of a precursor of a photosensitive polyimide resin on the base layer and the thin metal film;

(c) shows the step of patterning the coating by exposing the coating to light through a photomask and developing it; and (d) shows the step of curing the patterned coating to form the cover layer, FIG. 6 illustrates in section the steps of forming the magnetic head connecting terminals and the external connecting terminals in the state of their both sides being exposed, (a) shows the step of opening the supporting board at portions thereof for the magnetic head connecting terminals and the external connecting terminals to be formed;

(b) shows the step of peeling the thin metal film formed on the exposed conductive layer and supporting board;

(c) shows the step of opening the base layer exposed in the opening of the supporting board, so as to correspond in position to the opening;

(d) shows the step of peeling the ground exposed by opening the base layer; and (e) shows the step of forming a metal plated layer on each side of the exposed conductive layer, FIG. 11 illustrates in section the steps of forming the terminals in the state of their both sides being exposed in the producing method of a conventional suspension board with circuit, (a) shows the step of forming an opening for the terminal to be formed in the cover layer;

(b) shows the step of forming an opening for the terminal to be formed in the supporting board;

(c) shows the step of opening the base layer exposed in the opening of the supporting board, so as to correspond in position to the opening; and (d) shows the step of forming a metal plated layer on each side of the exposed conductive layer.

DETAILED DESCRIPTION OF THE PREFERRED EMBODIMENTS

Figure 1:
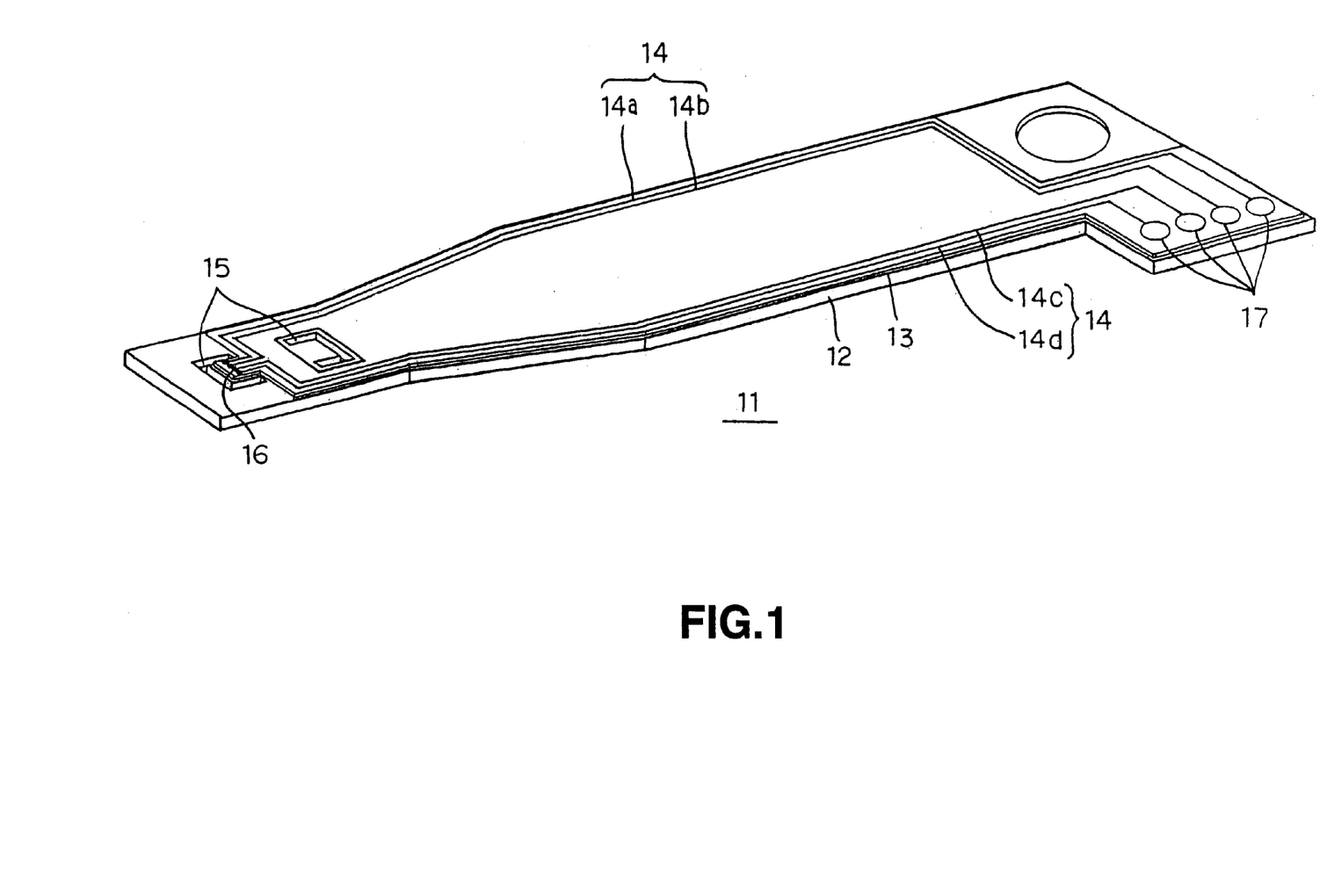
FIG. 1 is a perspective view showing a suspension board with circuit presented in the form of an embodiment of a wired circuit board of the present invention.

Referring to FIG. 1, there is a perspective view showing a suspension board with circuit presented in the form of an embodiment of a wired circuit board of the present invention. The suspension board with circuit 11 mounts thereon a magnetic head of a hard disk drive (not shown) and suspends the magnetic head while holding a minute interval between the magnetic head and a magnetic disk against airflow generated when the magnetic head and the magnetic disk run relative to each other. The suspension board with circuit has lines of wire 14a, 14b, 14c, 14d, integrally formed therewith in the form of a specific circuit pattern, for connecting the magnetic head and a read/write board formed as an external circuit.

In FIG. 1, the suspension board with circuit 11 has a base layer 13 formed as an insulating layer of insulating material. The base layer 13 is formed on a supporting board 12 extending longitudinally as a metal supporting layer. The conductive layer 14 is formed on the base layer 13 in the form of a specific circuit pattern. The circuit pattern is provided in the form of the plurality of lines of wire 14a, 14b, 14c, 14d arrayed in parallel and spaced apart at a predetermined interval.

Gimbals 15 for fitting the magnetic head therein are formed in the supporting board 12 by cutting out the supporting board 12 at a front end portion thereof. Formed at the front end portion of the supporting board 12 are magnetic head connecting terminals 16 to connect the magnetic head and the lines of wire 14a, 14b, 14c, 14d. Formed at the rear end portion of the supporting board 12 are external connecting terminals 17 to connect the read/write board and the lines of wire 14a, 14b, 14c, 14d. Though not shown in FIG. 1, the conductive layer 14 is actually covered with a cover layer 18 made of insulating material.

Figure 2:
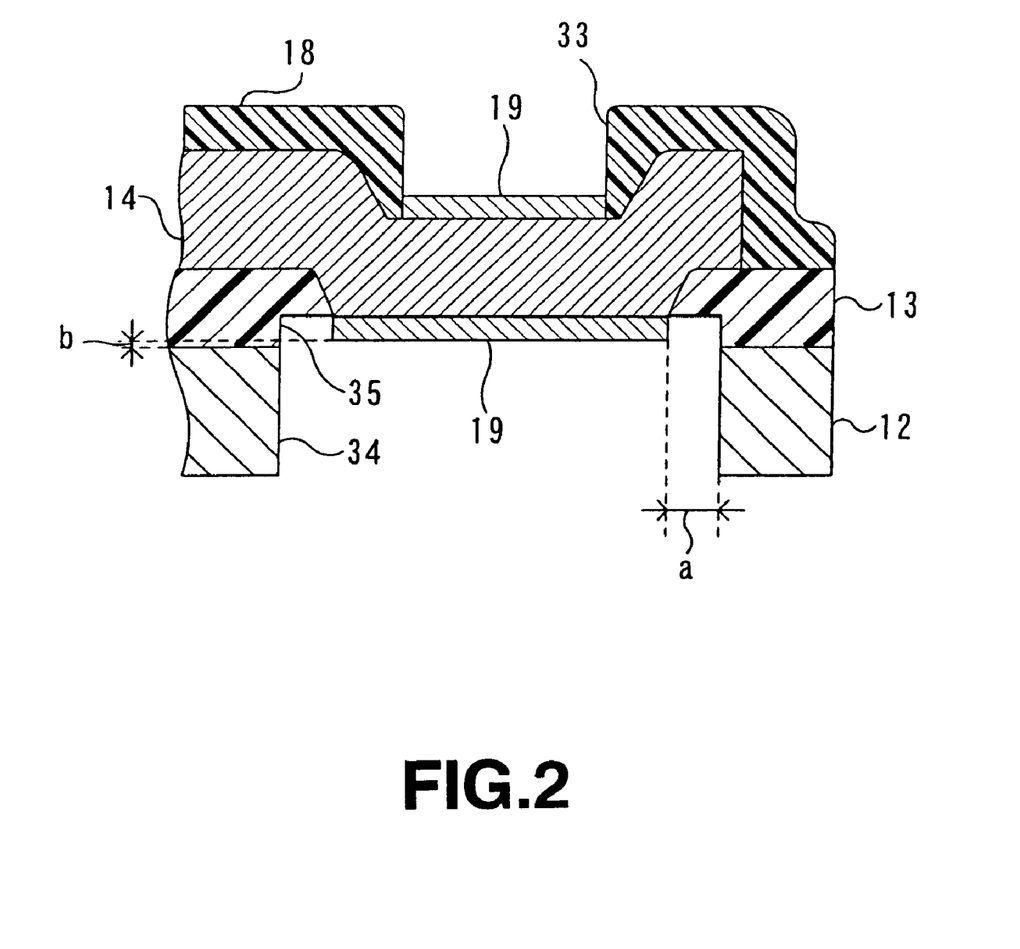
FIG. 2 is a sectional view taken along a longitudinal direction of the wiring, showing a magnetic head connecting terminal and an external connecting terminal of the suspension board with circuit shown in FIG. 1.

In this suspension board with circuit 11, the cover layer 18 is opened to expose a front side of the conductive layer 14 and also the supporting board 12 and the base layer 13 are opened to expose a back side of the conductive layer 14, so as to expose both sides of the conductive layer 14, and then the metal plating layers 19 as metal terminal layers are formed on both sides of the exposed conductive layer 14, whereby the magnetic head connecting terminals 16 and the external connecting terminals 17 are each formed as a terminal with its both sides being exposed, such as the so-called Flying Lead, as shown in FIG. 2. In FIG. 2, a ground 20 and a thin metal film 22 as will be mentioned later are omitted.

Referring now to FIGS. 3 to 6, a process for manufacturing the suspension board with circuit 11 will be described. Illustrated at the right side of FIGS. 3–6 are sectional views, taken along the longitudinal direction of the lines of wire 14a, 14b, 14c, 14d, of a part of the suspension board with circuit 11 in which the magnetic head connecting terminals 16 and the external connecting terminals 17 are formed. Illustrated at the left side of FIGS. 3–6 are sectional views, taken along a direction orthogonal to the longitudinal direction of the lines of wire 14a, 14b, 14c, 14d, of a certain part of the suspension board with circuit 11.

Figure 3:
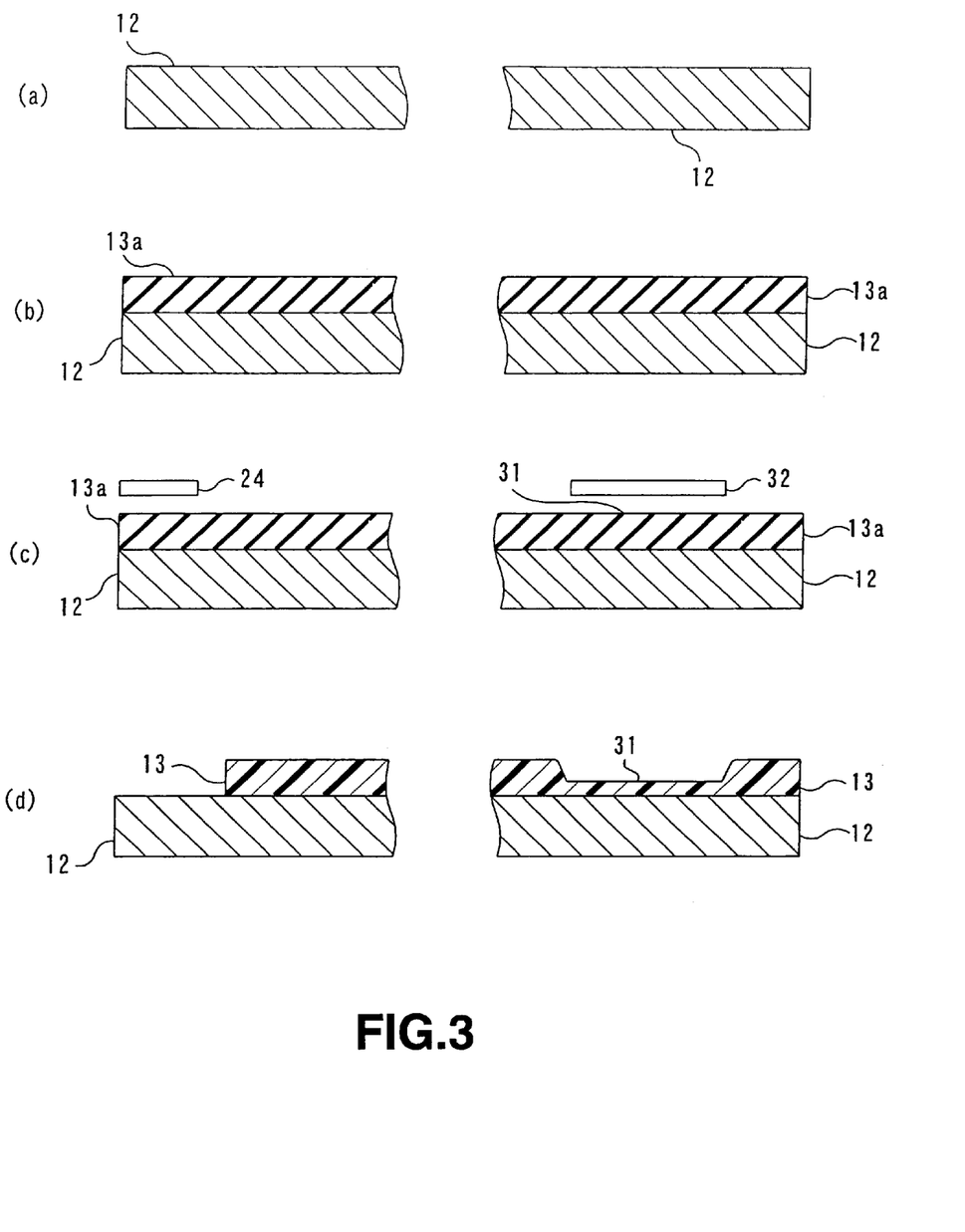

First, the supporting board 12 is prepared and the base layer 13 is formed on the supporting board 12 in the form of a specified pattern, as shown in FIG. 3. A metal foil or a metal sheet is preferably used as the supporting board 12. For example, stainless steel, 42 alloy and the like are preferably used. The supporting board used preferably has a thickness of 10–60 μm, or further preferably 15–30 μμm, and a width of 50–500 mm, or further preferably 125–300 mm.

Insulating material used for forming the base layer 13 is not limited to any particular insulating material. The insulating materials that may be used include, for example, synthetic resins such as polyimide resin, acrylic resin, polyether nitrile resin, polyether sulfonic resin, polyethylene terephthalate resin, polyethylene naphthalate resin and polyvinyl chloride resin. Of these synthetic resins, a photosensitive synthetic resin is preferably used as the base layer 13. A photosensitive polyimide resin is further preferably used.

Then, for example, in the case where the base layer 13 is formed in the specified pattern on the supporting board 12 by using photosensitive polyimide resin, a liquid solution of a precursor of the photosensitive polyimide resin is, as shown in FIG. 3(b), applied to the whole area of the supporting board 12 prepared as shown in FIG. 3(a), first, and then is heated at 60–150° C., or preferably at 80–120° C., to form a coating 13a of the precursor of the photosensitive polyimide resin.

Then, the coating 13a is exposed to light through photomasks 24 and 32, as shown in FIG. 3(c). If required, the exposed part is heated to a specified temperature. Thereafter, the coating 13a is developed to form the coating 13a into a specified pattern. Preferably, radiation irradiated for the exposure has an exposure wavelength of 300–450 nm, or preferably 350–420 nm. An integrated quantity of exposure light is preferably of 100–1,000 mJ/cm$^2$, or further preferably 200–700 mJ/cm$^2$. Further, when the exposed part of the coating 13a irradiated is heated, for example, at temperature of not less than 130° C. to less than 150° C., it is solubilized (positive type) for the next processing procedure (development), while on the other hand, when heated, for example, at temperature of not less than 150° C. to not more than 180° C., it is non-solubilized (negative type) for the next processing procedure (development). The development can be performed by any known method, such as a dipping process and a spraying process, by using a known developing solution such as alkaline developer. Preferably, the manufacturing method uses the negative type to produce the circuit pattern. Illustrated in FIG. 3 is an embodiment using the negative type of process steps for patterning the circuit.

As shown in FIG. 3(d), the coating 13a of the precursor of the polyimide resin thus patterned is finally heated, for example, to 250° C. or more to be cured (imidized), whereby the base layer 13 of polyimide resin is formed in the specified pattern.

In this method, in the step of forming the base layer 13 on the supporting board 12 in the specified pattern, an opening portion 31 of the base layer 13, which is opened in the later stage to expose the conductive layer 14, is made to have a smaller thickness than the remaining portions of the base layer 13, for forming the magnetic head connecting terminals 16 and the external connecting terminals 17.

The opening portion 31 of the base layer 13 can be made to have a smaller thickness than the remaining portions of the base layer 13, for example by use of a photomask 32 formed to have different transmissivity of irradiated light between the opening portion 31 of the coating 13a and the remaining portions of the coating 13a. After this photomask 32 is positioned over the opening portion 31 of the base layer 13, the coating 13a is exposed to light through the photomask 32 so that the opening portion 31 and the remaining portions of the coating 13a can be exposed in different amount of light exposure, and then is developed and cured.

The photomask 32 thus formed can allow the opening portion 31 and the remaining portions of the coating 13a to be exposed in different amounts of light exposure, thus enabling the opening portion 31 to have a smaller thickness than the remaining portions of the coating 13a in a simple and reliable manner.

To be more specific, when the coating 13a is patterned with a negative image, as shown in FIG. 3(c) and 3(d), the photomask 32 may be so structured that the transmissivity of irradiated light in the opening portion 31 of the coating 13a can be reduced more (preferably not more than 80% of the remaining portions) than in the remaining portions of the coating 13a. After this photomask 32 is positioned over the opening portion 31 of the base layer 13, the coating 13a is exposed to light through the photomask 32, so that the amount of light exposure in the opening portion 31 of the coating 13a is reduced more than the amount of light exposure in the remaining portions of the coating 13a, as shown in FIG. 3(c). Then, the coating 13a is developed and cured, as mentioned above. This can produce a smaller thickness for the opening portion 31 of the base layer 13 than that of the remaining portions of the base layer 13.

The photomask 32 may be formed to have difference transmissivity of irradiated light between the opening portion 31 of the coating 13a and the remaining portions of the coating 13a by the following manner. For example, an area of the surface of the photomask 32 corresponding to the opening portion 31 is finely roughened so that components of irregular reflection on the area of the photomask 32 can be increased to thereby produce reduced components of the transmitted light in that area. Or, an irradiated light absorbing film is stuck on the area of the surface of the photomask 32 corresponding to the opening portion 31 so that the components of the transmitted light in that area can be reduced. Or, a pattern having a light transmiting area and a light shielding area is formed on the area of the surface of the photomask 32 corresponding to the opening portion 31 so that the components of the transmitted light in that area can be reduced.

Further, in the case a photomask 32 of a thin metal film having a specified pattern is used, a thin metal film smaller than the thin metal film of the photomask 32 may be formed on the area of the surface of the photomask 32 corresponding to the opening portion 31 so that the components of the transmitted light in that area can be reduced. In other words, this photomask 32 is formed in the manner that after a photomask 32 having no thin metal film formed in the area thereof corresponding to the opening portion 31 (a conventional photomask) is formed, a resist is formed on that photomask 32 so as to expose only the opening portion 31, a thin metal film made of e.g. chromium smaller than the above-mentioned thin metal film is formed by vapor deposition or by plating and, thereafter, the resist is peeled.

These photomasks 32 can permit the amount of light exposure in the opening portion 31 to be surely adjusted by one exposure.

Of these photomasks, the photomask having the pattern including the light transmiting area and the light shielding area formed on the area of the surface thereof corresponding to the opening portion 31 is preferably used. Specifically, the photomasks 32a, 32b, 32c, 32d shown in FIGS. 7–10 are preferably used.

Each of these photomasks 32a, 32b, 32c, 32d shown in FIGS. 7–10 is made of a sheet of glass, such as quartz glass or soda glass, of thickness of 2–5 mm, and a thin metal film having a pattern is formed on an area of the glass corresponding to the opening portion 31, such that the transmissivity in that area can be reduced more than in the remaining areas. The pattern of the thin metal film can be formed, for example, by the process that after a thin metal film made of e.g. chromium is formed on the whole area of the glass by vapor deposition or by plating, the thin metal film is patterned by use of laser or electron beam. These photomasks 32a, 32b, 32c, 32d can permit the light exposure in the opening portion 31 to be surely controlled with a simple structure.

Figure 7:
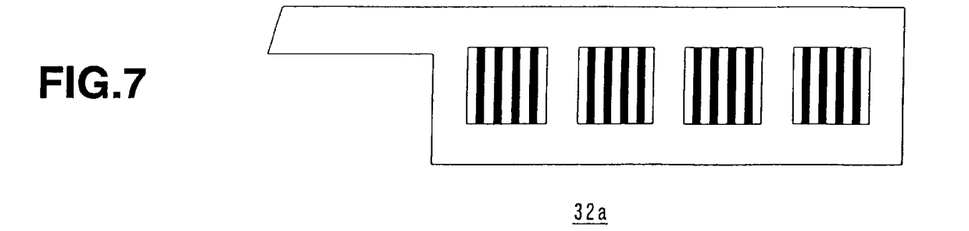
FIG. 7 is a schematic plan view of an embodiment of a photomask used for exposing the coating to light in the step of FIG. 3(b)

For example, the photomask 32a shown in FIG. 7 has, at its area corresponding to the opening portion 31, a striped pattern presented in the form of light transmitting portions and light shielding portions being alternately arranged at a not more than 6 μm pitch (width of the light transmitting portion and the light shielding portion) so that the averaged transmissivity of that area can be about 50% with respect to the remaining areas.

Figure 8:
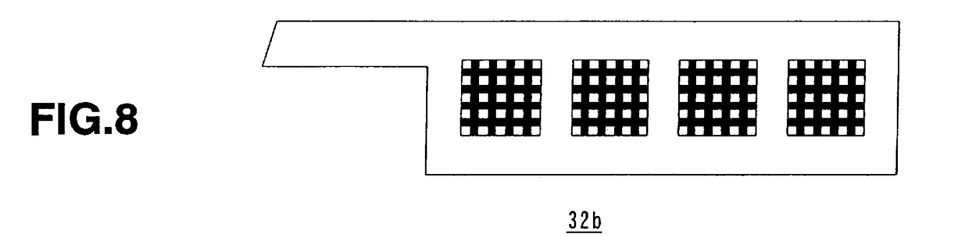
FIG. 8 is a schematic plan View of another embodiment of the photomask used for exposing the coating to light in the step of FIG. 3(b)

The photomask 32b shown in FIG. 8 has, at its area corresponding to the opening portion 31, a lattice pattern presented in the form of the light transmitting portions and the light shielding portions being alternately arranged at a not more than 6 μm pitch (width of the light transmitting portion and the light shielding portion) so that the averaged transmissivity of that area can be about 25% with respect to the remaining areas.

Figure 9:
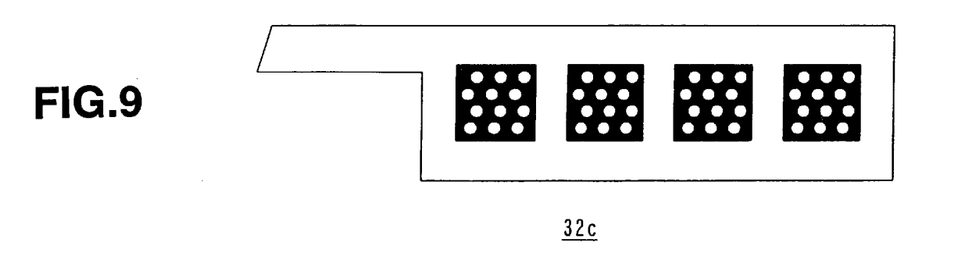
FIG. 9 is a schematic plan view of a further embodiment of a photomask used for exposing the coating to light in the step of FIG. 3(b)

The photomask 32c shown in FIG. 9 has, at its area corresponding to the opening portion 31, a staggered pattern presented in the form of round light transmitting portions having a diameter of not more than 6 μm being arranged in zigzag with respect to the remaining light shielding portion so that the averaged transmissivity of that area can be about 25% with respect to the remaining areas.

Figure 10:
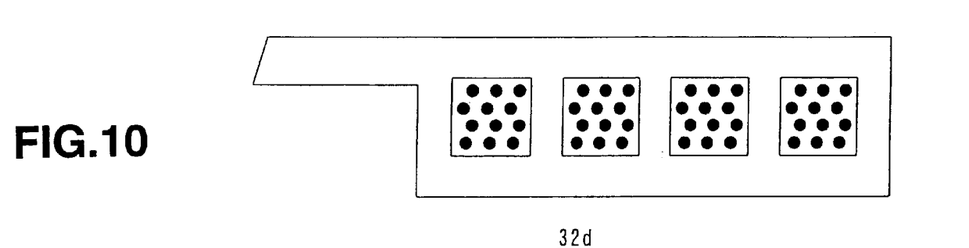
FIG. 10 is a schematic plan view of a yet another embodiment of a photomask used for exposing the coating to light in the step of FIG. 3(b)

The photomask 32d shown in FIG. 10 has, at its area corresponding to the opening portion 31, a staggered pattern presented in the form of round light shielding portions having a diameter of not more than 6 μm being arranged in zigzag with respect to the remaining light transmitting portion so that the averaged transmissivity of that area can be about 70% with respect to the remaining areas.

Of the photomasks 32a, 32b, 32c, 32d shown in FIGS. 7–10, those shown in FIGS. 7–9 of not more than 6 μm in width (pitch or diameter) of the striped, latticed or rounded light transmitting portion are preferable. The light transmitting portion having a width of not more than 6 μm permits the opening portion 31 to be uniformly irradiated with the irradiated light of exposure wavelength of 300–450 nm as mentioned above, and as such can allow the thickness of the opening portion 31 to be uniformly reduced. In contrast to this, the light transmitting portion having a width of more than 6 μm increases the resolving power of irradiated light, to thereby produce undulations in the opening portion 31 and, as a result, the opening portion 31 is made uneven in thickness so that the etching may not be performed in the later stage. Preferably, the light transmitting portion has a width of not more than 4 μm, or further preferably not more than 3 μm.

The averaged transmissivity in the opening portion 31 is preferably 50% or less, or further preferably 25% or less, with respect to the remaining portions.

The photomask 32 may be formed to be integral with the photomask 24 used for the patterning or may be formed to be separated therefrom.

When the coating 13a is patterned with a positive image, the photomask 32 may be so structured that the transmissivity of irradiated light in the opening portion 31 can be increased more than in the remaining portions.

The opening portion 31 of the base layer 13 can be made smaller in thickness than the remaining portions of the base layer 13, for example, by using a plurality of photomasks of different patterns to subject the opening portion 31 to light exposure or light shielding alternately at least two times, other than by using the photomask 32 formed to have different transmissivity of irradiated light between the opening portion 31 and the remaining portions.

Further, when a photosensitive resin is not used to form the base layer 13, for example a resin may be applied or layered in the form of a dry film on the supporting board 12 in the specified pattern. The opening 31 of the base layer 13 can then be made smaller in thickness than the remaining part of the base layer 13, for example, by layering the resin two or more times and also by layering the resin in the opening portion 31 a fewer number of times than in the remaining portions.

Preferably, the base layer 13 thus formed has a thickness of e.g. 2–30 μm, or preferably 5–20 μm. The base layer 13 usually has a thickness of about 10 μm. The thickness of the opening portion 31 of the base layer 13 is usually 80% or less of the thickness of the remaining portions. For example, the opening portion 31 preferably has a thickness of not more than 8 μm, or further preferably not more than 5 μm. Suppose that the opening portion 31 has a thickness of 8 μm or less, when the remaining portions have a usual thickness of 10 μm, as mentioned above, the time required for the opening to be formed in the later stage can be shortened by the extent corresponding to 2 μm.

The opening portion 31 of the base layer 13 may have a lower limit of thickness or a minimum thickness to serve as a barrier layer against the conductive layer 14 when the supporting board 12 is opened. For example, the opening portion 31 can have e.g. 3 μm, or further about 1 μm, as the minimum thickness. For example, the opening portion 31 of the base layer 13 preferably has a thickness of 0.1–8 μm or further preferably 1.0–5 μm.

Sequentially, the conductive layer 14 is formed on the base layer 13 in the form of a specified circuit pattern. The conductive layer 14 provided in the form of the specified pattern is made of conductive material. The conductive material may be used without any particular limitation. The conductive materials that may be used include, for example, copper, nickel, gold, solder or alloys thereof. Copper is preferably used. To form the conductive layer 14 in the specified circuit pattern, the conductive layer 14 may be formed on the base layer 13 in the specified pattern in any known patterning process, such as a subtracting process, an additive process and a semi-additive process.

In the subtracting process, the conductive layer 14 is first layered on the whole area of the base layer 13, through an adhesive layer, as required, and then an etching resist is formed on the conductive layer 14 so as to match with the specified circuit pattern. With the etching resist as a resist, the conductive layer 14 is etched and thereafter the etching resist is removed from the conductive layer 14.

In the additive process, a plating resist is formed on the base layer 13 in an opposite pattern to the specified circuit pattern, first. Then, the conductive layer 14 is formed in the form of the specified circuit pattern by plating on a surface of the base layer 13 on which the plating resist is not formed. Thereafter, the plating resist is removed.

In the semi-additive process, a thin film of conductive material that is formed as a ground is formed on the base layer 13, first, and then a plating resist is formed on the ground in an opposite pattern to the specified circuit pattern. Then, the conductive layer 14 is formed in the form of a specified circuit pattern by plating on a surface of the ground on which the plating resist is not formed. Thereafter, the plating resist and the ground on which the plating resist is layered are removed.

Figure 4:
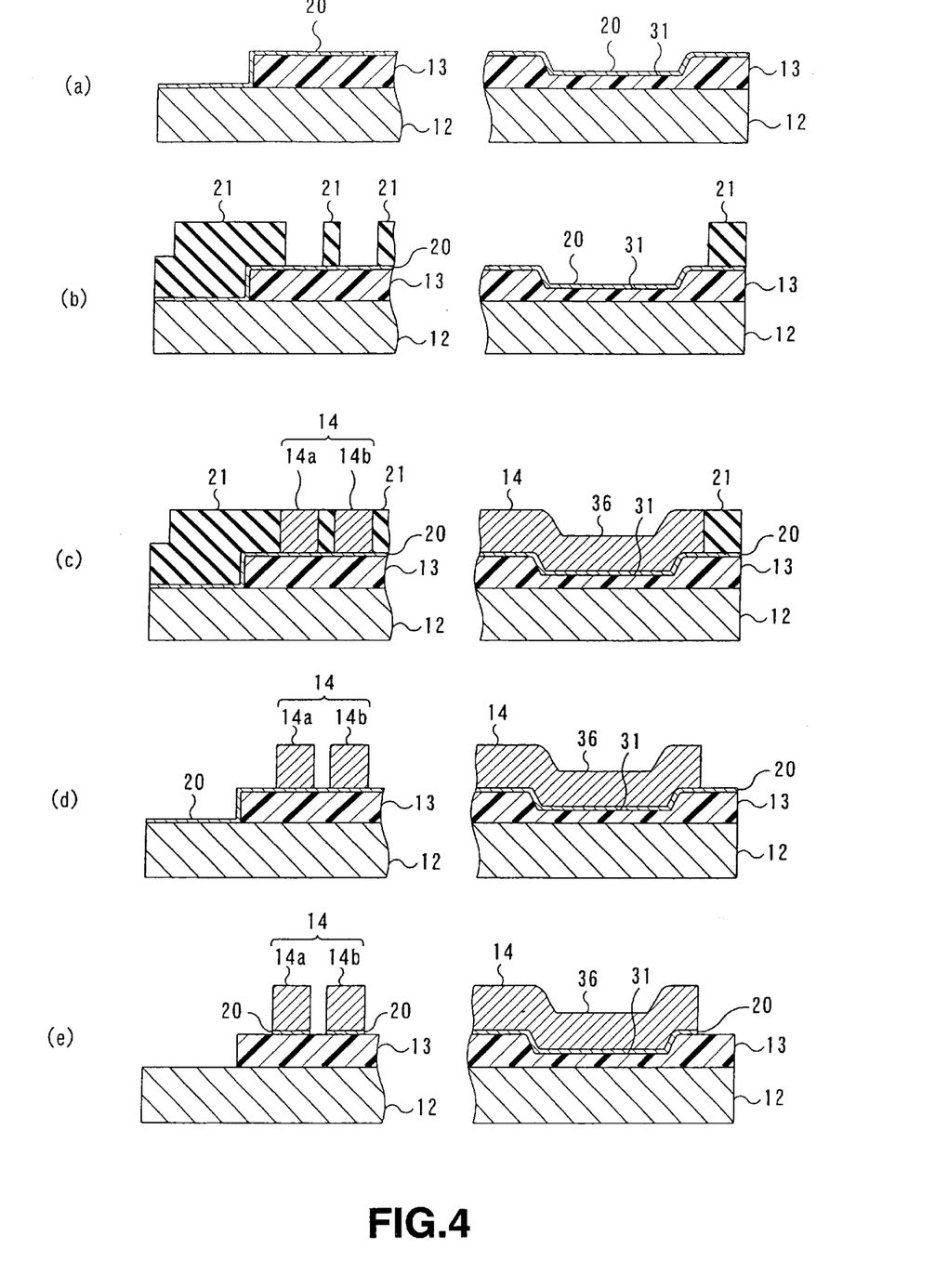

Of these patterning processes, the semi-additive process is preferably used, as shown in FIG. 4. First, a thin film of the conductive material that forms the ground 20 is formed on the whole area of the supporting board 12 and the base layer 13, as shown in FIG. 4(a). Preferably, the ground 20 is formed by use of a vacuum deposition process, or by use of a sputtering deposition process. Chromium and copper are preferably used as the conductive material that forms the ground 20. To be more specific, a thin chrome film and a thin copper film are preferably formed in sequence on the whole area of the supporting board 12 and the whole area of the base layer 13 by the sputtering deposition process. Preferably, the thin chrome film has a thickness of 100–600 Å and the thin copper film has a thickness of 500–2,000 Å.

Sequentially, the plating resist 21 having the opposite pattern to the specified circuit pattern is formed on the ground 20, as shown in FIG. 4(b). The plating resist 21 can be provided by a known process in the form of a specified resist pattern, for example, by using a dry film resist. Then, the conductive layer 14 having the specified circuit pattern is formed on a portion of the ground 20 where the plating resist 21 is not formed, by plating, as shown in FIG. 4(c). Though either of electrolysis plating and electroless plating may be used, electrolysis plating is preferably used. Among others, electrolysis copper plating is preferably used. The circuit pattern is formed in the form of a pattern formed, for example, by a plurality of lines of wire 14a, 14b, 14c, 14d which are spaced apart in parallel with a given interval, as shown in FIG. 1. The conductive layer 14 has thickness of e.g. 2–15 µm, or preferably 5–10 µm. The lines of wire 14a, 14b, 14c, 14d each have a width of e.g. 10–500 µm, or preferably 30–200 µm. The interval between the adjacent lines of wire 14a, 14b, 14c, 14d is e.g. 10–200 µm, or preferably 30–100 µm.

Then, the plating resist 21 is removed by a known etching process, such as a chemical etching process (wet etching), or by peeling, as shown in FIG. 4(d). Thereafter, the part of the ground 20 on which the plating resist 21 was formed is likewise removed by a known etching process, such as the chemical etching process, as shown in FIG. 4(e). Through these process steps the conductive layer 14 is formed on the base layer 13 in the form of the specified circuit pattern.

The base layer 13 is formed to have reduced thickness at the opening portions 31, so that the conductive layer 14 thus formed has, at portions thereof corresponding to the opening portions 31 or at terminal forming portions 36 on which a metal plated layer 19 is formed in the later stage, concave portions hollowed toward the supporting board 12 with respect to the remaining portions of the conductive layer 14 to an extent corresponding to the reduced thickness.

Figure 5:
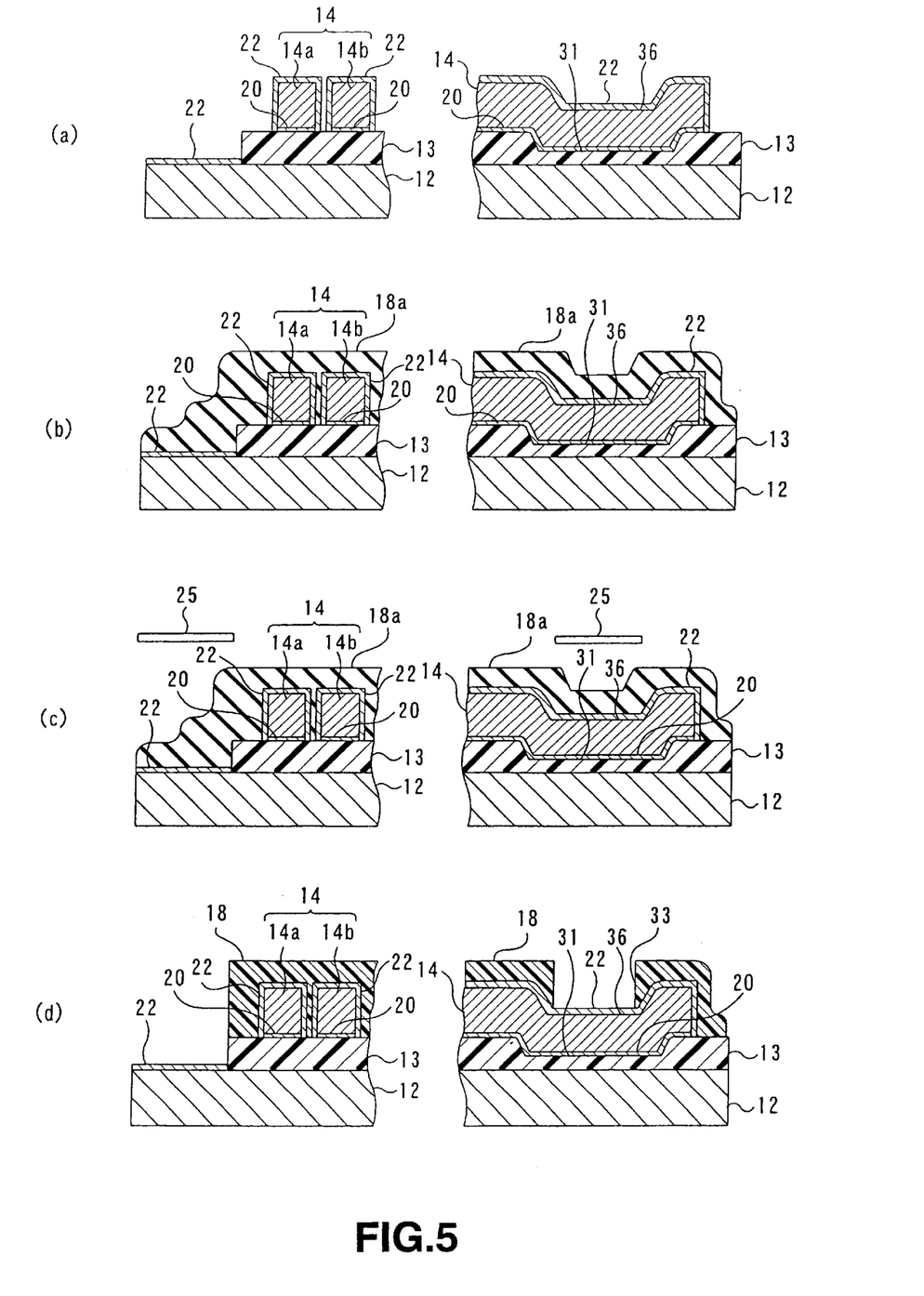

Sequentially, the conductive layer 14 is covered with a thin metal film 22, first, and then is covered with a cover layer 18 of insulating material, as shown in FIG. 5. Specifically, the thin metal film 22 is first formed on both of the surface of the conductive layer 14 and the surface of the supporting board 12, as shown in FIG. 5(a). Preferably, the thin metal film 22 is provided in the form of a rigid nickel thin film by electroless nickel plating. The coating 22 is just required to have a thickness to prevent the conductive layer 14 from being bared. For example, it is enough for the coating 22 to have a thickness of about 0.05 to about 0.1 µm.

Sequentially, the cover layer 18 for covering the conductive layer 14 is provided in the form of a specified pattern. The same insulating material is used as the insulating material for forming the cover layer 18. Preferably, photosensitive polyimide resin is used.

In the case where the cover layer 18 is formed by using the photosensitive polyimide resin, a liquid solution of a precursor of the photosensitive polyimide resin is applied to the whole area of the base layer 13 and the thin metal film 22, and then is heated at e.g. 60–150° C., or preferably at 80–120° C., to form a coating 18a of the precursor of the photosensitive polyimide resin, as shown in FIG. 5(b). Then, the coating 18a is exposed to light through the photomask 25, as shown in FIG. 5(c). If required, the exposed part is heated to a certain temperature. Thereafter, the coating 18a is developed to be patterned so that the conductive layer 14 can be covered with the coating 18a.

When the coating 18a is patterned, openings 33 are formed in the places in which the magnetic head connecting terminals 16 and the external connecting terminals 17 are formed so that the thin metal film 22 formed on terminal forming portions 36 of the conductive layer 14 can be exposed, as shown in FIG. 5(c) and 5(d). The openings 33 are formed to correspond in position, size and shape to the terminal forming portions 36 of the conductive layer 14.

The coating 18a can be exposed and developed under the same condition as the condition for exposing and developing the coating 13a to form the base layer 13. The patterning of the coating 18a is preferably produced with the negative image. Shown in FIG. 5 is an embodied form in which the coating 18a is patterned with the negative image.

As shown in FIG. 5(d), the coating 18a of the precursor of the polyimide resin thus patterned is finally heated, for example, to 250° C. or more to be cured (imidized), whereby the cover layer 18 made of polyimide resin is formed on the conductive layer 14. The cover layer 18 has a thickness of e.g. 1–30 µm, or preferably 2–5 µm.

Figure 6:
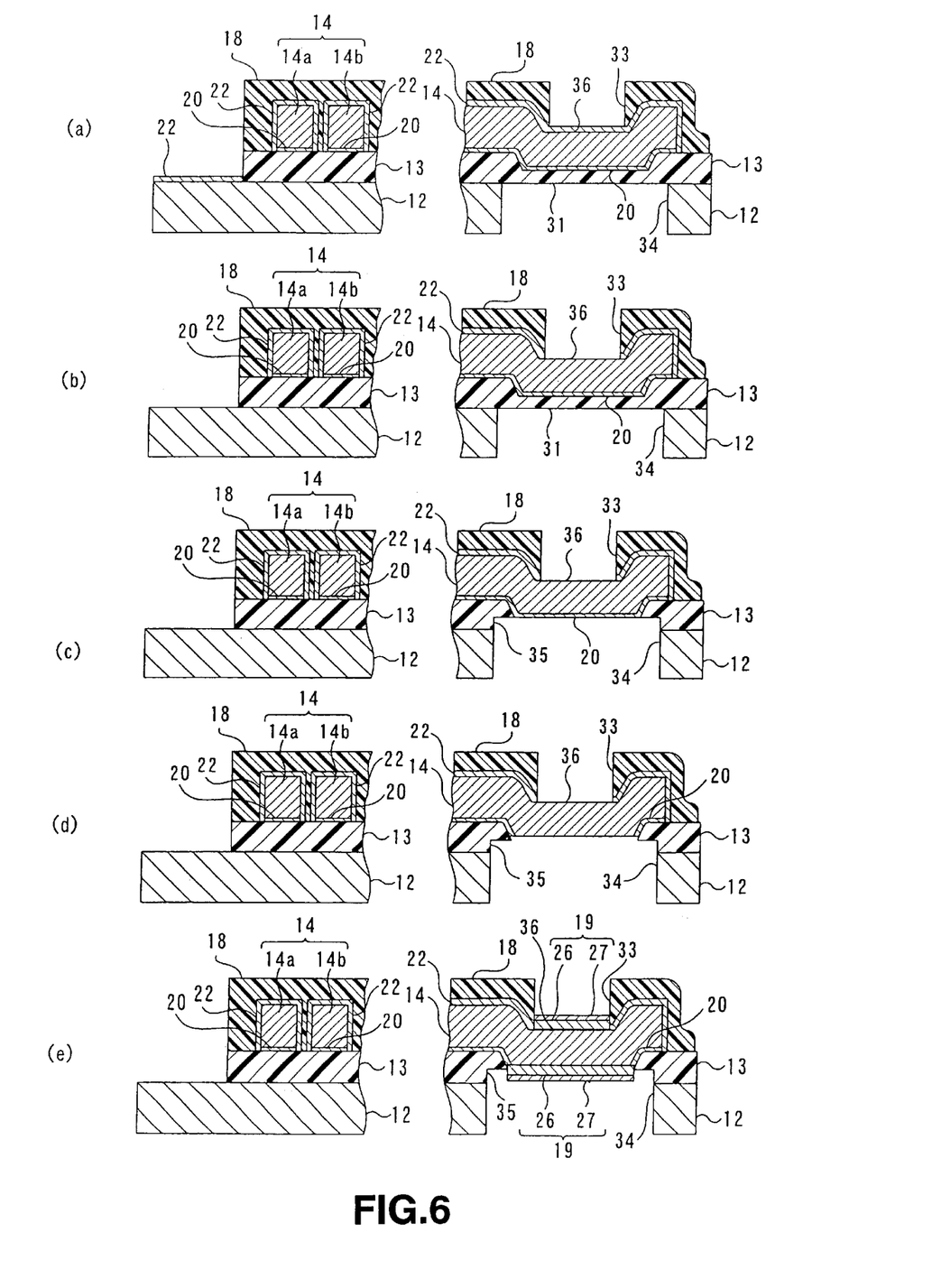

Sequentially, the magnetic head connecting terminals 16 and the external connecting terminals 17 are so formed that their both sides are exposed or are provided in the form of the so-called Flying Lead, as shown in FIG. 6.

The magnetic head connecting terminals 16 and the external connecting terminals 17 can be provided in the form of their both sides being exposed by the following process. First, as shown in FIG. 6(a), openings 34 are formed in the supporting board 12 at portions thereof where the magnetic head connecting terminals 16 and the external connecting terminals 17 are formed or at portions thereof opposite to the openings 33 of the cover layer 18, so that the opening portions 31 of the base layer 13 can be exposed. The openings 34 can be formed by any known method. For example, after all of the area of the supporting board 12 except for the areas corresponding to the openings 34 are subjected to masking, they are chemically etched. The openings 34 are formed to be larger than the opening portions 31, so as to include the opening portions 31 of the base layer 13.

At the same time as the forming of the openings 34, gimbals 15 are cut into a predetermined shape by chemical etching.

Sequentially, as shown in FIG. 6(b), the thin metal film 22 as was exposed by opening the cover layer 18 is peeled and, at the same time as this, the thin metal film 22 formed on the supporting board 12 is also peeled.

Then, as shown in FIG. 6(c), openings 35 are formed in the base layer 13 including the opening portions 31 exposed in the openings 34 of the supporting board 12, so as to expose the ground 20 formed on the back side of the terminal forming portion 36 of the conductive layer 14. The openings 35 can be formed by any known method. Preferably, the openings 35 are formed by etching or by plasma etching, in particular. The etching enables a portion of the base layer 13 extending from the exposed surface of the base layer 13 to the ground 20 formed in the back side of the terminal forming portion 36 of the conductive layer 14 to be precisely cut, and as such can allow the back side of the terminal forming portion 26 to be surely exposed without damaging it in the later process.

In the plasma etching, the supporting board 12 can be used as the mask to etch the entire base layer 13 including the opening portions 31 exposed in the openings 34 of the supporting board 12. For example, after the sample is disposed between opposed electrodes in an atmosphere in which a prescribed gas is filled in therebetween, high-frequency plasma is produced therebetween. The prescribed gases that may be used include, for example, He, Ne, Ar, Xe, Kr, $N_2$, $O_2$, $CF_4$ and $NF_3$. Of these gases, Ar, $O_2$, $CF_4$ and $NF_3$ are preferably used. These gases may be used in mixture in a prescribed proportion. The gas pressure (degree of vacuum) is, for example, 0.5–200 Pa, or preferably 10–100 Pa. The conditions for producing the high-frequency plasma require a frequency of e.g. 10 kHz–20 MKz, preferably 10 kHz–100 kHz, and power for the plasma etching of e.g. 0.5–10 $W/cm^2$, or preferably 1–5 $W/cm^2$. The frequency of 10 kHz–100 kHz can make it easy to match with a plasma etching device (tune for resistances). In these atmospheric conditions, the sample is disposed on electrodes whose temperature is controlled to e.g. 0–120° C., or preferably 10–80° C. and is etched for a specified time for the base layer 13 to be etched to have a predetermined thickness.

Since the openings 35 of the base layer 13 thus formed are formed by using the supporting board 12 as the mask, they can be formed in the same size and shape as the openings 34 of the supporting board 12. Consequently, the openings 35 are formed to be larger than the terminal forming portions 36 of the conductive layer 14 and, as a result of this, a certain space is defined with respect to the thickness direction between the periphery of the ground 20 formed on the back side of the terminal forming portion 36 exposed in the opening 35 of the base layer 13 and the periphery of the opening 34 of the supporting board 12.

Thereafter, as shown in FIG. 6(d), the portions of the ground 20 exposed in the openings 35 of the base layer 13 are peeled to expose the back side of the terminal forming portions 36 of the conductive layer 14. Sequentially, as shown in FIG. 6(e), metal plated layers 19 are simultaneously formed by plating on both sides of the terminal forming portions 36 of the conductive layer 14 thus exposed. Through these processes, the magnetic head connecting terminals 16 and the external connecting terminals 17 are formed with their both sides being exposed. The metal plated layers 19 can be formed by using either electrolysis plating or electroless plating, without any particular limitation. Also, the plating can be formed by using any known metal, without any particular limitation. Preferably, electrolysis nickel plating and electrolysis gold plating are sequentially performed to form a gold plated layer 27 on a nickel plated layer 26. Preferably, the nickel plated layer 26 and the gold plated layer 27 both have a thickness of about 1 $\mu$m to about 5 $\mu$m.

The metal plated layer 19 thus formed leaves a specified space between the periphery of the metal plated layer 19 and the periphery of the opening 35 of the base layer 13 and between the periphery of the metal plated layer 19 and the periphery of the opening 34 of the supporting board 12, respectively.

When the suspension board with circuit 11 is produced by this method, the opening portions 91 of the base layer 13 to be opened to expose the terminal forming portions 36 are formed to have smaller a thickness than the remaining portions of the base layer 13 in the process of forming the base layer 13. Consequently, when the opening portions 31 are etched in the process of forming the magnetic head connecting terminals 16 and the external connecting terminals 17, the time required for the terminal forming portions 36 of the conductive layer 14 to be exposed can be shortened to an extent corresponding to the difference between the reduced thickness of the opening portions 31 and the thickness of the remaining portions. This enables the terminal forming portions 36 of the conductive layer 14 to be exposed in a short time, and as such can provide improved efficiency in forming the magnetic head connecting portions 16 and the external connecting portions 17 with their both sides being exposed.

Thus, this method enables the suspension board with circuit 11 to be produced with improved production efficiency, and as such can provide the suspension board with circuit 11 at reduced costs.

In addition, in this method, since the openings 35 of the base layer 13 and the openings 34 of the supporting board 12 are formed to be larger than the terminal forming portions 36 of the conductive layer 14, a specified space is defined between the periphery of the metal plated layer 19 and the periphery of the opening 35 of the base layer 13 and between the periphery of the metal plated layer 19 and the periphery of the opening 34 of the supporting board 12, respectively. This can produce the effect that, for example, when the metal plated layer 19 is increased in thickness for improvement in connection reliability, the periphery of the metal plated layer 19 and the periphery of the opening 34 of the supporting board 12 can be prevented from contacting with each other. This can surely prevent occurrence of a short circuit from the contact between the metal plated layer 19 and the supporting board 12, thus providing improved connection reliability and voltage proof property of the suspension board with circuit 11.

Preferably, the interval between the periphery of the metal plated layer 19 and the opening 34 of the supporting board 12 (the interval a in FIG. 2) is at least 1 $\mu$m, or more preferably about 2 $\mu$m to about 40 $\mu$m.

Further, in this method, since the base layer 13 is formed to have a reduced thickness at the opening portions 31, the conductive layer 14 has, at the terminal forming portions 36 formed on the opening portions 31, concave portions hollowed toward the supporting board 12 with respect to the remaining portions of the conductive layer 14 to an extent corresponding to the reduced thickness. Due to this, the distance from the front side of the supporting board 12 to the front side of the metal plated layer 19 is shortened to an extent corresponding to the concave portion and, as a result of this, the metal plated layers 19 are placed closer to the outside of the supporting board 12 to that extent. This can produce the effect that for example when the connecting terminals of the magnetic head or read/write board are connected with the metal plated layers 19 in such a manner that those connecting terminals are laid over the metal plated layers 19 and are bonded to each other via supersonic vibration of a bonding tool, pressure bonding can be well ensured, thus providing further improved connection reliability.

Preferably, the widthwise interval between the front side of the metal plated layers 19 and the interface between the base layer 13 and the supporting board 12 (the interval b shown in FIG. 2) is ±6 μm, or further preferably ±2 μm.

In the suspension board with circuit 11 of the embodiment of the invention illustrated above, the terminal forming portions 36 of the conductive layer 14 are hollowed with respect to the remaining portions and also the openings 34 of the supporting board 12 are formed to be larger than the terminal forming portions 36 of the conductive layer 14, whereby a specified space is formed between the periphery of the metal plated layer 19 and the periphery of the opening 34 of the supporting board 12. Depending on the intended objects and applications, the specified space may be formed between the periphery of the metal plated layer 19 and the periphery of the opening 34 of the supporting board 12, without hollowing the terminal forming portion 36 of the conductive layer 14 with respect to the remaining portions, as shown in FIGS. 12 and 13.

Figure 12:
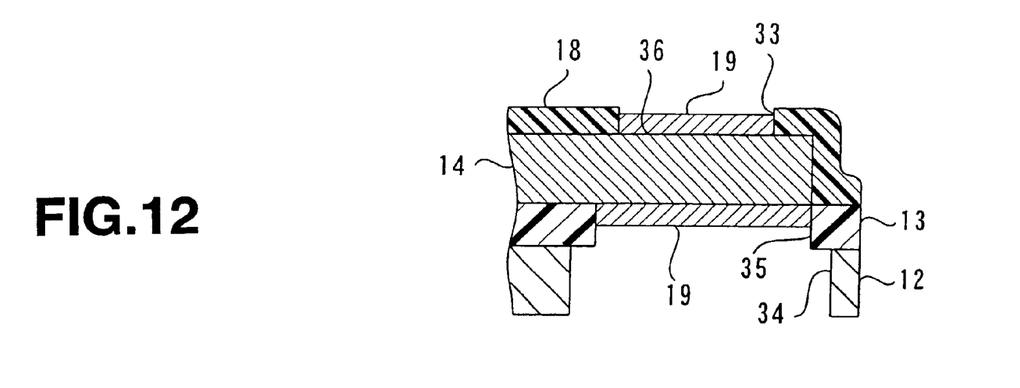
FIG. 12 is a sectional view taken along a longitudinal direction of the wiring, showing another embodiment of the magnetic head connecting terminal and external connecting terminal of the suspension board with circuit shown in FIG. 1.

In the suspension board with circuit 11 of the embodiment shown in FIG. 12, after the openings 33 of the cover layer 18 are formed, the openings 34 of the supporting board 12 are formed and also the openings 35 of the base layer 13 are formed to be smaller than the openings 34 of the supporting board 12, whereby the metal plated layers 19 are formed on both sides of the conductive layer 14 thus exposed. The openings 35 of the base layer 13 can be made smaller than the openings 34 of the supporting board 12 in such a manner that the openings 35 of the base layer 13 are etched, with the supporting board 12 as the mask, first, and then the openings 34 of the supporting board 12 are further etched so as to increase the width of the opening.

Figure 13:
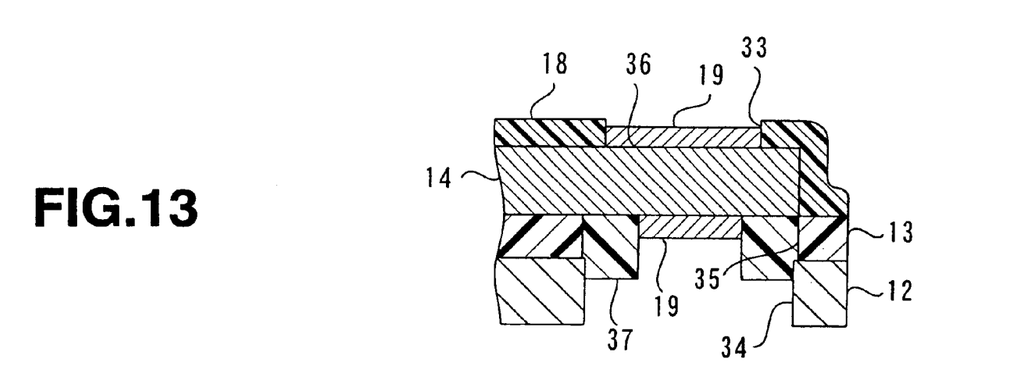
FIG. 13 is a sectional view taken along a longitudinal direction of the wiring, showing a further embodiment of the magnetic head connecting terminal and external connecting terminal of the suspension board with circuit shown in FIG. 1.

In the suspension board with circuit 11 of the embodiment shown in FIG. 13, after the openings 33 of the cover layer 18 and the openings 34 of the supporting board 12 are formed, the openings 35 of the base layer 13 are formed by etching with the supporting board 12 as the mask. Further, a terminal protecting layer 37 of insulating material is formed around the periphery of the opening 34 of the supporting board 12 and the periphery of the opening 35 of the base layer 13. Thereafter, the metal plated layers 19 are formed on both sides of the conductive layer 14 thus exposed.

EXAMPLES

While in the following, the present invention will be described in further detail with reference to Examples, the present invention is not limited to any Examples.

Example 1

A liquid solution of the precursor of the photosensitive polyimide resin was applied on a stainless steel foil (SUS304 H-TA) having a thickness of 25 μm so that after dried, it could have a thickness of 24 μm and then dried at 130° C. to thereby form a coating of the precursor of the photosensitive polyimide resin. Sequentially, the coating was exposed to light (405 nm, 1,500 mJ/cm$^2$) through a photomask. The exposed part was heated to 180° C. and then developed by using an alkaline developer, whereby the coating was patterned with a negative image. Sequentially, the patterned coating of the precursor of the photosensitive polyimide resin was heated at 350° C. to be cured (imidized), whereby a base layer made of polyimide resin of thickness of 10 μm was formed in the specified pattern.

In the step of forming the base layer, the photomask of metal film, which has a lattice pattern presented in the form of light transmitting portions and light shielding portions being alternately arranged at a not more than 6 μm pitch (which corresponds to the photomask 32b shown in FIG. 8 having the averaged transmissivity of the opening portion of about 25% with respect to the remaining portions), was positioned over the opening portions of the coating to be opened in the later stage so as to expose the conductive layer in the areas in which the magnetic head connecting terminals and the external connecting terminals are formed. Then, the coating was exposed to light through the photomask, so that the amount of light exposure in the opening portion of the coating could be reduced more than the amount of light exposure in the remaining portions of the coating. Then, the coating was developed and cured. As a result of this, a base layer having a thickness of 2 μm at the opening portion thereof and a thickness of 10 μm at the remaining portions thereof was obtained.

Sequentially, as a ground, a thin chrome film of thickness of 300 Å and a thin copper film having thickness of 700 Å were formed in sequence on the whole area of the stainless steel foil and the base layer by a sputtering deposition process. Thereafter, a plating resist having an opposite pattern to the specified circuit pattern was formed by use of a dry film resist, and a conductive layer having the specified circuit pattern was formed in the part of the base layer where the plating resist was not formed, by electrolysis copper plating. As a result of the base layer being formed to have reduced thickness at the opening portions, the conductive layer thus formed had, at the terminal forming portions formed on the opening portions of the conductive layer, concave portions hollowed toward the stainless steel foil from the remaining portions of the conductive layer with respect to the thickness direction by about 8 μm. The conductive layer had a thickness of 20 μm and was formed to have a pattern defined by four lines of wire each having a width of 20 μm and being spaced apart in parallel at an interval of 30 μm.

Thereafter, the plating resist was removed by chemical etching and then the thin chromium film and the thin copper film on which the plating resist had been formed were removed by chemical etching.

Sequentially, a hard, thin nickel film having a thickness of 0.1 μm was formed on the surface of the conductive layer and the surface of the stainless steel foil by electroless nickel plating. Thereafter, a liquid solution of a precursor of the photosensitive polyimide resin was applied on the thin nickel film and the base layer and then heated at 130° C. to thereby form a coating of the precursor of the photosensitive polyimide resin. Sequentially, the coating was exposed to light (405 nm, 1,500 mJ/cm$^2$) through a photomask. The exposed part was heated to 180° C. and then developed by using an alkaline developer, whereby the coating was patterned so that the conductive layer could be covered with the coating. Sequentially, the patterned coating of the precursor of photosensitive polyimide resin was heated at 350° C. to be cured (imidized), whereby a cover layer formed of polyimide resin of a thickness of 3 μm was formed on the conductive layer.

It is to be noted that in the step of forming the cover layer, openings were formed in the cover layer so that when the cover layer was patterned, the thin metal film formed on the terminal forming portions of the conductive layer could be exposed. The openings were formed to correspond to the terminal forming portions of the conductive layer in position as well as in size and shape.

Sequentially, the magnetic head connecting terminals and the external connecting terminals were formed with their both sides being exposed. First, openings larger than the opening portions of the base layer were formed in the stainless steel foil at portions thereof corresponding to the openings of the cover layer so that the opening portions of the base layer could be exposed. The openings of the stainless steel foil were formed in a manner that after all areas of the stainless steel foil except the opening forming portions were subjected to masking, the stainless foil was subjected to chemical etching. At the same time as the forming of the openings, gimbals were cut into a predetermined shape by the chemical etching.

Sequentially, the thin metal film as was exposed by opening the cover layer was peeled and, at the same time as this, the thin metal film formed on the stainless steel foil was peeled.

Then, openings were formed in the base layer including the opening portions exposed in the openings of the stainless steel foil, so as to expose the ground formed on the back side of the terminal forming portion of the conductive layer. The openings of the base layer were formed by plasma etching. In the plasma etching, with the stainless steel foil as the mask, the entire base layer including the opening portions exposed in the openings of the stainless steel foil was etched for 2 minutes under conditions of: a mixed gas of CF$_4$ and O$_2$ (CF$_4$/O$_2$=20/80) used as the gas filled; a gas pressure (degree of vacuum) of 25 Pa; a frequency of 13.5 MKz; and power required for the plasma etching of 2,500W.

The openings of the base layer thus formed were formed in the same size and shape as the openings of the stainless steel foil, so that a space of about 30 μm was defined between the periphery of the ground exposed in the openings of the base layer and the periphery of the opening of the base layer and the periphery of the opening of the stainless steel foil.

Thereafter, the portions of the ground exposed in the openings of the base layer were peeled to expose the back side of the terminal forming portions of the conductive layer. Sequentially, the metal plated layers were formed by performing electrolysis nickel plating and following electrolysis gold plating, so that a nickel plated layer having a thickness of 2 μm and a gold plated layer having a thickness of 1 μm were formed on both sides of the terminal forming portions of the conductive layer thus exposed.

The metal plated layers on the back side of the terminal forming portions thus formed have a thicknesswise interval of ±2 μm between the front side of the metal plated layers and an interface between the base layer and the stainless steel foil and also have the interval of 26 μm between the periphery of the metal plated layer and the periphery of the opening of the base layer and the periphery of the opening of the stainless steel foil.

Example 2

A suspension board with circuit whose magnetic head connecting terminals and external connecting terminals were formed with their both sides being exposed was produced in the same operation as in Example 1, except that a patterned photomask having a different structure was used when the precursor of the photosensitive polyimide resin was exposed to light; a thin metal film smaller in thickness than the above-mentioned thin metal film was formed on the surface of the photomask at the areas corresponding to the opening portions of the base layer so that the transmissivity in those areas could be about 40% with respect to the remaining portions.

When the base layer was formed, the opening portions of the base layer were formed to be 3 μm in thickness, whereas the remaining portions of the base layer were formed to be 10 μm in thickness. This enabled the opening portions to be etched by plasma etching for about 3 minutes. Also, the metal plated layer on the back side of the terminal forming portions of the conductive layer left a thicknesswise interval of ±2 μm between the front side of the metal plated layer and the interface between the base layer and the stainless steel foil.

Example 3

A suspension board with circuit whose magnetic head connecting terminals and external connecting terminals were formed with their both sides being exposed was produced in the same operation as in Example 1, except that the precursor of the photosensitive polyimide resin was exposed to light (405 nm, 600 mJ/cm$^2$) by using a photomask that does not shield the light transmitting through its area corresponding to the opening portion of the base layer, first, and then exposed to light (405 nm, 1,500 mJ/cm$^2$) by using a photomask that shields the light transmitting through the area corresponding to the opening portion of the base layer. In this exposure process, the exposure was performed twice. Because of this, Example 3 was disadvantageous, as compared with Examples 1 and 2, in that the second exposure pattern must be aligned with the first exposure pattern precisely and that an increased number of works and relatively complex works were required.

Comparative Example 1

A suspension board with circuit whose magnetic head connecting terminals and external connecting terminals were formed in a state in which their both sides were exposed was produced in the same operation as in Example 1, except that when the precursor of the photosensitive polyimide resin was exposed to light, no photomask was arranged over the area corresponding to the opening portion of the base layer, so that the base layer was formed to have an even thickness of 10 μm and, thereafter, the metal plated layers were formed on the whole area of the conductive layer exposed in whole area of the openings of the base layer opened by using the supporting board as the mask, It took about 10 minutes to etch the base layer by plasma etching. Also, the suspension board with circuit thus formed left no thicknesswise space between the periphery of the metal plated layer on the back side of the terminal forming portion of the conductive layer and the periphery of the opening of the base layer and the periphery of the opening of the supporting board. In addition, a thicknesswise interval of ±2 µm was defined between the front side of the metal plated layer and the interface between the base layer and the stainless steel foil.

While illustrative embodiments of the present invention are provided in the above description, such is for illustrative purpose only and is not to be construed restrictively. Modification and variation of the present invention that will be obvious to those skilled in the art are to be covered by the following claims.

What is claimed is:

1. A wired circuit board comprising an insulating layer formed on a metal supporting layer, a conductive layer formed on the insulating layer, a surface of the conductive layer being exposed by opening the metal supporting layer and the insulating layer, and a metal terminal layer formed on the conductive layer exposed in the openings of the metal supporting layer and the insulating layer, wherein a specified space is defined between a periphery of the metal terminal layer and a periphery of the opening of the metal supporting layer.

2. The wired circuit board according to claim 1, wherein the conductive layer has a terminal forming portion for forming the metal terminal layer and the terminal forming portion is hollowed toward the metal supporting layer with respect to the remaining portions of the conductive layer.

3. The wired circuit board according to claim 1, which is a suspension board with circuit.

* * * * *

UNITED STATES PATENT AND TRADEMARK OFFICE
CERTIFICATE OF CORRECTION

PATENT NO.    : 6,388,201 B2
DATED         : May 14, 2002
INVENTOR(S)   : Takeshi Yamato et al.

It is certified that error appears in the above-identified patent and that said Letters Patent is hereby corrected as shown below:

<u>Column 3,</u>
Line 53, "FIG. 8 is a schematic plan View of…" should be -- FIG. 8 is a schematic plan view of… --.

<u>Column 11,</u>
Line 29, "the terminal forming portion 26 to…" should be -- the terminal forming portion 36 to… --.

<u>Column 12,</u>
Line 23, "this method, the opening portions 91 of…" should be -- this method, the opening portions 31 of… --.
Line 25, "formed to have smaller a thickness than…" should be -- formed to have a smaller thickness than… --.

Signed and Sealed this

Fifth Day of November, 2002

Attest:

Attesting Officer

JAMES E. ROGAN
Director of the United States Patent and Trademark Office